US012681553B2

(12) United States Patent
Xue et al.

(10) Patent No.: US 12,681,553 B2
(45) Date of Patent: Jul. 14, 2026

(54) STORAGE DEVICE, SYSTEM-ON-CHIP INCLUDING THE STORAGE DEVICE, AND COMPUTING APPARATUS

(71) Applicant: SHENZHEN MICROBT ELECTRONICS TECHNOLOGY CO., LTD., Shenzhen (CN)

(72) Inventors: Ke Xue, Shenzhen (CN); Zhijun Fan, Shenzhen (CN); Chao Xu, Shenzhen (CN); Jianbo Liu, Shenzhen (CN); Zuoxing Yang, Shenzhen (CN)

(73) Assignee: Shenzhen Microbt Electronics Technology Co., Ltd., Guangdong (CN)

( * ) Notice: Subject to any disclaimer, the term of this patent is extended or adjusted under 35 U.S.C. 154(b) by 183 days.

(21) Appl. No.: 18/842,665

(22) PCT Filed: Jun. 25, 2024

(86) PCT No.: PCT/CN2024/101168
§ 371 (c)(1),
(2) Date: Aug. 29, 2024

(87) PCT Pub. No.: WO2025/060551
PCT Pub. Date: Mar. 27, 2025

(65) Prior Publication Data
US 2026/0178101 A1     Jun. 25, 2026

(30) Foreign Application Priority Data
Sep. 20, 2023     (CN) .......................... 202311212878.7

(51) Int. Cl.
| G06F 1/324 | (2019.01) |
| G06F 1/10 | (2006.01) |
| G11C 7/22 | (2006.01) |

(52) U.S. Cl.
CPC ................ *G06F 1/324* (2013.01); *G06F 1/10* (2013.01); *G11C 7/22* (2013.01)

(58) Field of Classification Search
CPC .............. G06F 1/324; G06F 1/10; G11C 7/22
(Continued)

(56) References Cited

U.S. PATENT DOCUMENTS

| 6,351,170 | B1 | 2/2002 | Takahashi et al. |
| 2019/0089337 | A1* | 3/2019 | Venugopal ......... H03K 3/35625 |

FOREIGN PATENT DOCUMENTS

| CN | 101341656 A | 1/2009 |
| CN | 102610269 A | 7/2012 |

(Continued)

*Primary Examiner* — Huan Hoang
(74) *Attorney, Agent, or Firm* — Dickinson Wright PLLC

(57) ABSTRACT

The present disclosure relates to a storage device, a system-on-chip including the storage device, and a computing apparatus. The storage device includes a storage module and a clock gating module. The storage module includes latch units each assigned with an address and having an input end for receiving write data. The clock gating module includes first and second stages of clock gating units. The first stage receives an input clock signal and an enable signal obtained based on first address decoding of a write address and output an enable clock signal to a respective clock gating unit of the second stage. The second stage receives an enable clock signal outputted by a respective clock gating unit of the first stage and an enable signal obtained based on second address decoding of the write address and output an enable clock signal to a respective latch unit.

16 Claims, 8 Drawing Sheets

(58) Field of Classification Search
USPC ....................................................... 365/233.1
See application file for complete search history.

(56) References Cited

FOREIGN PATENT DOCUMENTS

| | | | |
|---|---|---|---|
| CN | 103218011 A | 7/2013 |
| CN | 103219037 A | 7/2013 |
| CN | 105334906 A | 2/2016 |
| CN | 110349604 A | 10/2019 |
| CN | 112863571 A | 5/2021 |
| CN | 116248111 A | 6/2023 |
| CN | 116959519 A | 10/2023 |
| TW | 201505372 A | 2/2015 |
| TW | 202037081 A | 10/2020 |

* cited by examiner

140
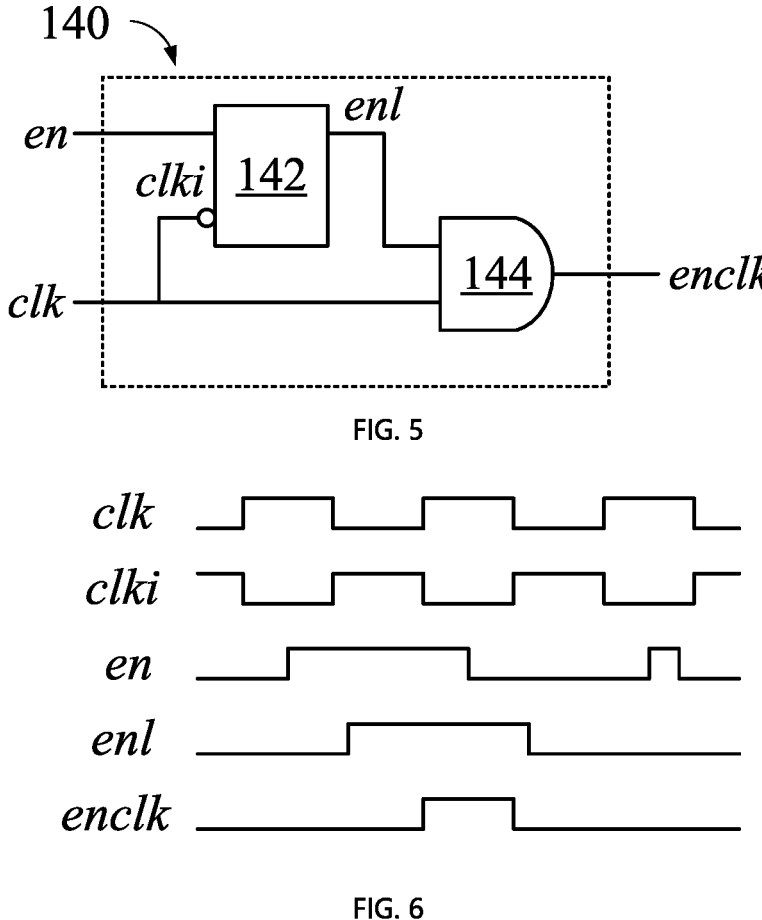
FIG. 5
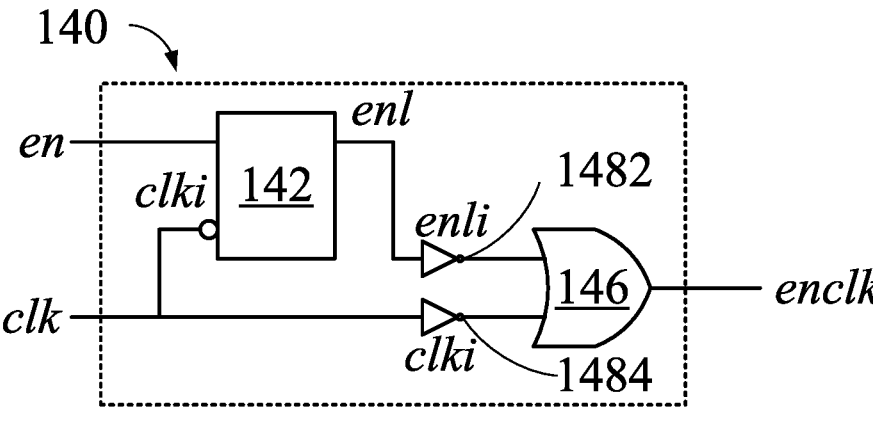
FIG. 6
140
FIG. 7

140 en clk

144 enclk

STORAGE DEVICE, SYSTEM-ON-CHIP INCLUDING THE STORAGE DEVICE, AND COMPUTING APPARATUS

CROSS-REFERENCE TO RELATED APPLICATIONS

This application is a national stage of International Application No. PCT/CN2024/101168, filed on Jun. 25, 2024, which claims priority to Chinese Patent Application No. 202311212878.7, filed on Sep. 20, 2023. Both of the aforementioned applications are hereby incorporated by reference in their entireties.

TECHNICAL FIELD

The present disclosure relates to the technical field of integrated circuits, and more specifically, to a storage device, a system-on-chip including the storage device, and a computing apparatus.

BACKGROUND

FIG. 1 schematically shows a latch storage array with latches as storage units, the size of which can be indicated by a bit width n and a depth m. The bit width of n bits defines one storage unit of the latch storage array to be n bits, that is, a width of data written each time is n bits, and a width of data read each time is n bits. The depth m defines a number of n-bit storage units included in the latch storage array. An address, for example, addresses 0, 1, 2, . . . , (m−1) as shown in FIG. 1, may be assigned to each storage unit in the latch storage array. When a write operation is performed, address decoding may be performed according to a write address to write data into a corresponding storage unit in the latch storage array. When a read operation is performed, address decoding may be performed according to a read address to read data stored in a corresponding storage unit in the latch storage array.

SUMMARY

According to a first aspect of the present disclosure, a storage device is provided, comprising a storage module and a clock gating module. The storage module comprises a plurality of latch units each being assigned with an address. An input end of each of the plurality of latch units is configured to receive write data. The clock gating module comprises a first stage of clock gating units and a second stage of clock gating units coupled between the plurality of latch units and the first stage of clock gating units. Each clock gating unit of the first stage of clock gating units is configured to receive an input clock signal and an enable signal obtained based on first address decoding of a write address and output an enable clock signal to a respective clock gating unit of the second stage of clock gating units. Each clock gating unit of the second stage of clock gating units is configured to receive an enable clock signal outputted by a respective clock gating unit of the first stage of clock gating units and an enable signal obtained based on second address decoding of the write address and output an enable clock signal to a respective latch unit of the plurality of latch units.

In some embodiments, the clock gating module further comprises one or more stages of clock gating units coupled between the first stage of clock gating units and the second stage of clock gating units. Each clock gating unit of each stage of clock gating units of the one or more stages of clock gating units is configured to receive an enable clock signal outputted by a respective clock gating unit of an upper stage of clock gating units of the one or more stages of clock gating units and an enable signal obtained based on respective address decoding of the write address and output an enable clock signal to a respective clock gating unit of a lower stage of clock gating units of the one or more stages of clock gating units. In such embodiments, each clock gating unit of the first stage of clock gating units is configured to receive the input clock signal and the enable signal obtained based on the first address decoding of the write address and output the enable clock signal to a respective clock gating unit of an uppermost stage of clock gating units of the one or more stages of clock gating units, and each clock gating unit of the second stage of clock gating units is configured to receive an enable clock signal outputted by a respective clock gating unit of a lowermost stage of clock gating units of the one or more stages of clock gating units and the enable signal obtained based on the second address decoding of the write address and output the enable clock signal to the respective latch unit of the plurality of latch units.

In some embodiments, the plurality of latch units are grouped at levels, and groups obtained from grouping the plurality of latch units at each level is obtained by further dividing groups obtained from grouping the plurality of latch units at an upper level. A number of stages of clock gating units comprised in the clock gating module may correspond to a number of levels for grouping the plurality of latch units. A number of clock gating units comprised in each stage of clock gating units in the clock gating module may correspond to a number of groups obtained from grouping the plurality of latch units at a respective level.

In some embodiments, the enable signal received by each clock gating unit of each stage of clock gating units in the clock gating module is obtained based on address decoding of the write address corresponding to the respective level.

In some embodiments, an address of each latch unit of the plurality of latch units comprises different parts corresponding to different levels. In some embodiments, addresses of latch units in a same group at a same level have a same part.

In some embodiments, the address is binary. In some embodiments, address decoding of the write address corresponding to each level is associated with respective several bits of the write address. In some embodiments, a number of bits of the respective several bits is decided by a number of bits of a binary representation of a ratio of a number of groups obtained from grouping the plurality of latch units at the level to a number of groups obtained from grouping the plurality of latch units at an upper level.

In some embodiments, each clock gating unit of the first stage of clock gating units is coupled, via other stage of clock gating units in the clock gating module, to a respective group of latch units obtained from grouping the plurality of latch units at a first level, and each clock gating unit of the second stage of clock gating units is coupled to a respective group of latch units obtained from grouping the plurality of latch units at a second level below the first level.

In some embodiments, the storage module further comprises an additional latch unit assigned with an address, and an input end of the additional latch unit is configured to receive the write data. The clock gating module further comprises an additional clock gating unit coupled to the additional latch unit and configured to receive the input clock signal and an enable signal obtained based on address decoding of the write address and output an enable clock signal to the additional latch unit.

In some embodiments, the storage device further comprises a flip-flop unit and a clock source unit. The flip-flop unit is configured to output the write data to the storage module based on a received clock signal. The clock source unit is coupled to the flip-flop unit and the clock gating module, respectively, and is configured to provide the input clock signal. In some embodiments, the storage device further comprises a clock delay unit coupled between the clock source unit and the flip-flop unit, and is configured to receive the input clock signal and delay the input clock signal based on a delay of the enable clock signal received by a latch unit corresponding to the write address in the storage module relative to the input clock signal, and output the delayed input clock signal to the flip-flop unit. In some embodiments, the clock delay unit comprises one or more of: a clock buffer; an inverter. In some embodiments, the flip-flop unit is triggered by a rising edge, a rising edge of the delayed input clock signal is closer to a rising edge of the enable clock signal received by the latch unit corresponding to the write address in the storage module compared with a rising edge of the input clock signal. In some embodiments, the flip-flop unit is triggered by a falling edge, a falling edge of the delayed input clock signal is closer to a falling edge of the enable clock signal received by the latch unit corresponding to the write address in the storage module compared with a falling edge of the input clock signal.

According to a second aspect of the present disclosure, a system-on-chip is provided, comprising the storage device according to the first aspect of the present disclosure.

According to a third aspect of the present disclosure, a computing apparatus is provided, comprising the system-on-chip according to the second aspect of the present disclosure.

BRIEF DESCRIPTION OF THE DRAWINGS

The accompanying drawings that constitute a part of the specification describe embodiments of the present disclosure, and are used to explain the principle of the present disclosure together with the specification.

The present disclosure can be understood more clearly from the following detailed descriptions with reference to the accompanying drawings, where:

FIG. 5 shows a circuit diagram of a clock gating unit according to some embodiments of the present disclosure;

FIG. 6 shows an example waveform diagram of signals of the clock gating unit of FIG. 5;

FIG. 7 shows a circuit diagram of a clock gating unit according to some embodiments of the present disclosure;

Figure 1:
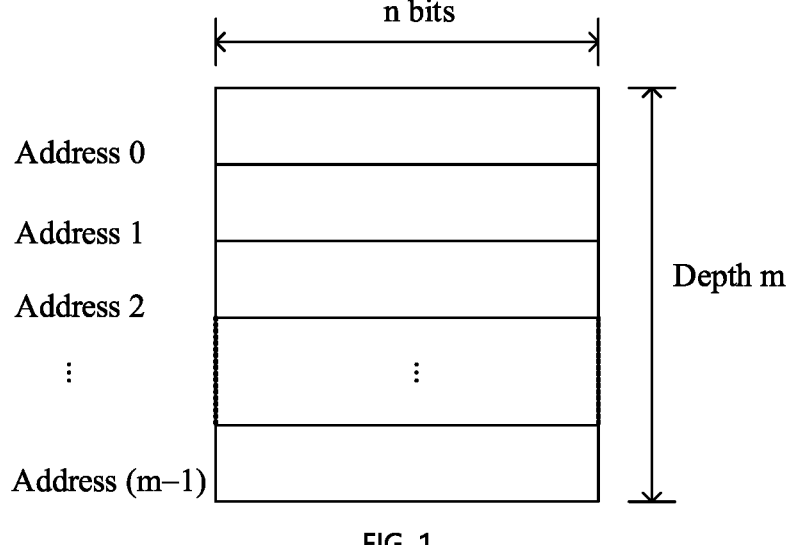
FIG. 1 shows a latch storage array with latches as storage units.

It is to be noted that in the embodiments illustrated below, sometimes the same reference signs are jointly used across different accompanying drawings to represent the same parts or parts with the same function, and repeated descriptions thereof are omitted. In the specification, similar numbers and letters are used to represent similar items. Therefore, once a certain item is defined in an accompanying drawing, it does not need to be further discussed in subsequent accompanying drawings.

For ease of understanding, locations, sizes, scopes, and the like of structures shown in the accompanying drawings or the like sometimes do not represent practical locations, sizes, scopes, and the like. Therefore, the disclosed invention is not limited to the locations, the sizes, the scopes, and the like disclosed in the accompanying drawings or the like. Moreover, the accompanying drawings are not necessarily drawn to scale, and some features may be enlarged to show details of specific components.

DETAILED DESCRIPTION

Various exemplary embodiments of the present disclosure are described in detail with reference to the accompanying drawings below. It is to be noted that, unless otherwise illustrated specifically, relative arrangement of components and steps, numerical expressions, and values stated in these embodiments do not limit the scope of the present disclosure.

Practically, the following descriptions of at least one exemplary embodiment are merely illustrative, and in no way constitute any limitation on the present disclosure and the application or use thereof. In other words, the structure and the method herein are shown in an exemplary manner to illustrate different embodiments of the structure and the method in the present disclosure. However, a person skilled in the art will understand that they merely illustrate exemplary rather than exhaustive manners in which the present disclosure may be implemented.

Moreover, the accompanying drawings are not necessarily drawn to scale, and some features may be enlarged to show details of specific components.

In addition, a technology, a method, and a device known to a person of ordinary skill in the related art may not be discussed in detail, but in proper circumstances, said technology, method, and device shall be regarded as a part of the specification.

In all examples that are shown and discussed herein, any specific value should be interpreted only as an example but not as a limitation. Therefore, there may be different values in other examples of the exemplary embodiments.

In the present disclosure, the units are generally implemented by a circuit, and therefore the terms "unit" and "circuit" are used interchangeably herein. For example, "latch unit" and "latch circuit" may be used interchangeably, terms "clock gating unit" and "clock gating circuit" may be used interchangeably, "flip-flop unit" and "flip-flop circuit" may be used interchangeably, "clock source unit" and "clock source circuit" may be used interchangeably, "clock delay unit" and "clock delay circuit" may be used interchangeably, and so on.

Figure 2:
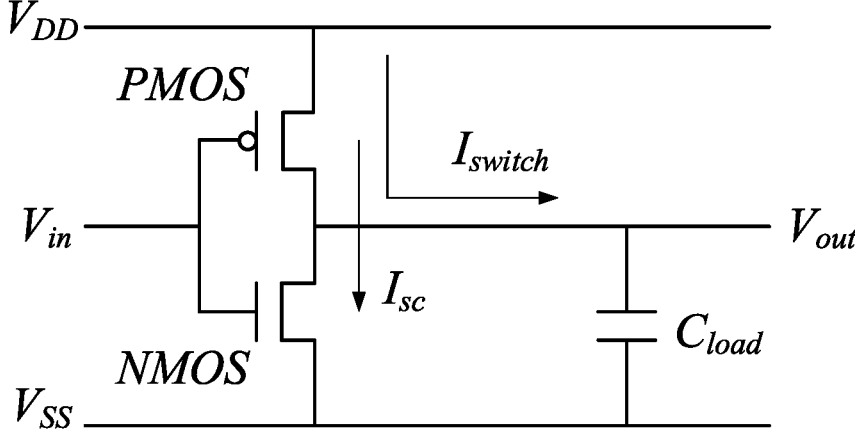
FIG. 2 shows a logic gate circuit.

FIG. 2 shows a logic gate circuit. As shown in FIG. 2, the logic gate (exemplary illustrated as a NOT gate) includes a P-type metal oxide semiconductor (PMOS) transistor and an N-type metal oxide semiconductor (NMOS) transistor connected in series between a power supply terminal $V_{DD}$ and a grounding terminal Vss. A gate of the PMOS transistor and a gate of the NMOS transistor are connected to serve as an input end of the logic gate for receiving a voltage $V_{in}$. A drain of the PMOS transistor and a drain of the NMOS transistor are connected to serve as an output end of the logic gate for outputting a $V_{out}$. The logic gate is connected to a load capacitor $C_{load}$. A static power consumption of this circuit includes an electric leakage power consumption, and a dynamic power consumption thereof includes a flipping power consumption and a short-circuit power consumption. When the logic gate is flipped, a switch current $I_{switch}$ will cause charging and discharging of the load capacitor $C_{load}$, such that the flipping power consumption is generated. In addition, when both the PMOS transistor and the NMOS transistor are conducting, a short-circuit current $I_{sc}$ may generate the short-circuit power consumption. In particular, the flipping power consumption is calculated as $P_{switch}=(V_{DD}^2 \times C_{load} \times T_r) \div 2$, where $V_{DD}$ represents a power supply voltage, $C_{load}$ represents the load capacitance, and $T_r$ represents a flipping rate of a signal (for example, if a clock signal is flipped twice in a cycle, the flipping rate of the clock signal is 2), that is, a frequency of flipping of the logic gate.

Figure 3:
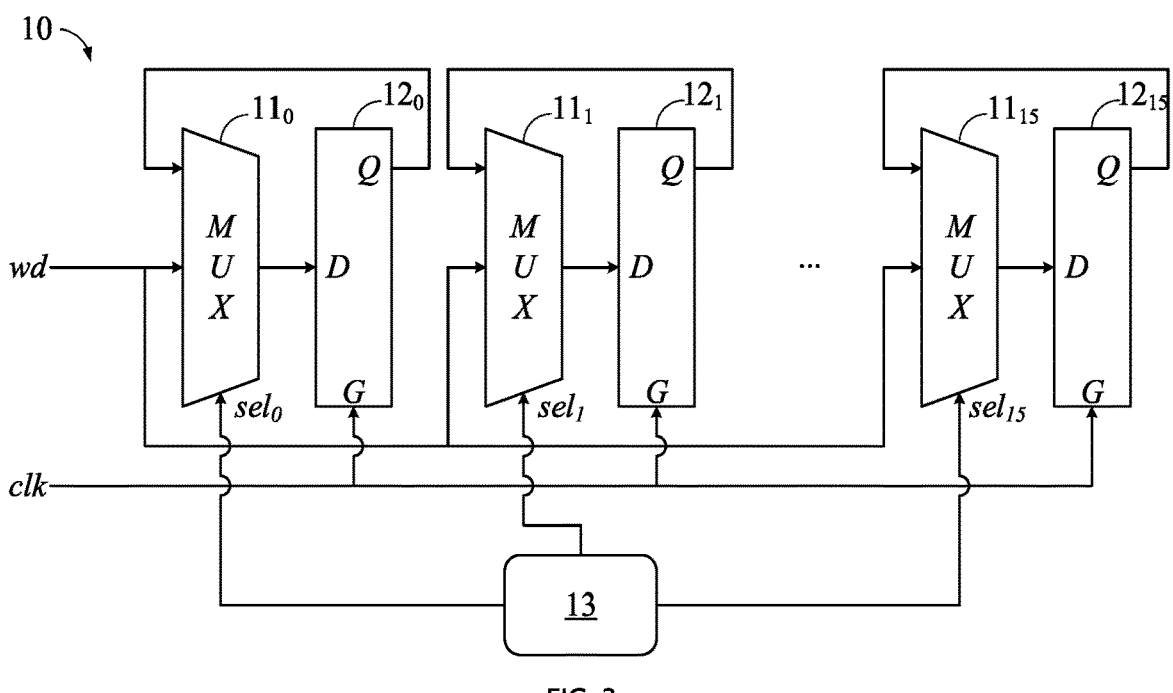
FIG. 3 shows a circuit diagram of a storage device according to some comparative examples of the present disclosure.

When data is written to a latch, a logic gate circuit of the latch will flip, generating a dynamic power consumption. When a flipping rate of a signal in the latch is higher, according to the analysis described above, the dynamic power consumption may be higher; and this is not desired. For example, FIG. 3 shows a storage device 10 according to some comparative examples of the present disclosure. The storage device 10 includes a plurality of (taking sixteen as an example) latch units $12_0$, $12_1$, . . . , $12_{15}$ (which sometimes may be collectively referred to as a latch unit 12 herein) which may be arranged in an array form. Each latch unit 12 may have an input end D, an output end Q, and a clock control end G. The clock control end G is configured to receive an input clock signal clk. When the input clock signal clk enables signal flipping to occur at the clock control end G of the latch unit 12, data received at the input end D of the latch unit 12 may be written into the latch unit 12. Respective one multiplexer unit (MUX) 11 of a plurality of multiplexer units $11_0$, $11_1$, . . . , $11_{15}$ (which sometimes may be collectively referred to as a multiplexer unit 11 herein) is further arranged before each latch unit 12 of the latch units $12_0$, $12_1$, . . . , $12_{15}$. Each multiplexer unit 11 has a first input end for receiving write data wd and a second input end for receiving an output at an output end Q of respective one latch unit 12. Each multiplexer unit 11 has an output end coupled to an input end D of respective one latch unit 12. The storage device 10 may further include or be coupled to an address decoding unit 13 configured to perform address decoding on a write address for generating selection signals $sel_0$, $sel_1$, . . . , $sel_{15}$, which are respectively fed to the multiplexer units $11_0$, $11_1$, . . . , $11_{15}$ for selecting whether to output the write data wd to the respective latch units $12_0$, $12_1$, . . . , $12_{15}$ or to hold original data of the latch units $12_0$, $12_1$, . . . , $12_{15}$. For example, if it is assumed that the write address corresponds to the latch unit $12_0$, the selection signal $sel_0$ is configured to select the write data wd as an output of the multiplexer unit $11_0$ so that the write data wd is written to the latch unit $12_0$, whereas the selection signals $sel_1$, . . . , $sel_{15}$ are configured to select original data of the latch unit $12_1$, . . . , $12_{15}$ as outputs of the multiplexer units $11_1$, . . . , $11_{15}$ so that the write data wd is not written to the latch units $12_1$, . . . , $12_{15}$. Therefore, when a write operation is performed, signal flipping occurs at the clock control end G of each latch unit 12, and signals in each multiplexer unit 11 also flip, which results in a higher dynamic power consumption. Moreover, the bit width of the multiplexer unit 11 needs to be equal to that of the latch unit 12, and therefore more chip area will be occupied.

In view of this, the present disclosure provides a storage device, in which complex multiplexer logic is omitted, and instead, clock control logic is used to perform a write operation on a latch unit designated by a write address, thereby simplifying data writing logic, saving chip area, and reducing a power consumption. Storage devices according to various embodiments of the present disclosure are described below in detail with reference to the accompanying drawings. It should be understood that an actual storage device may further include other components, and these other components are neither discussed herein nor shown in the accompanying drawings so as to avoid obscuring of the key points of the present disclosure.

Figure 4:
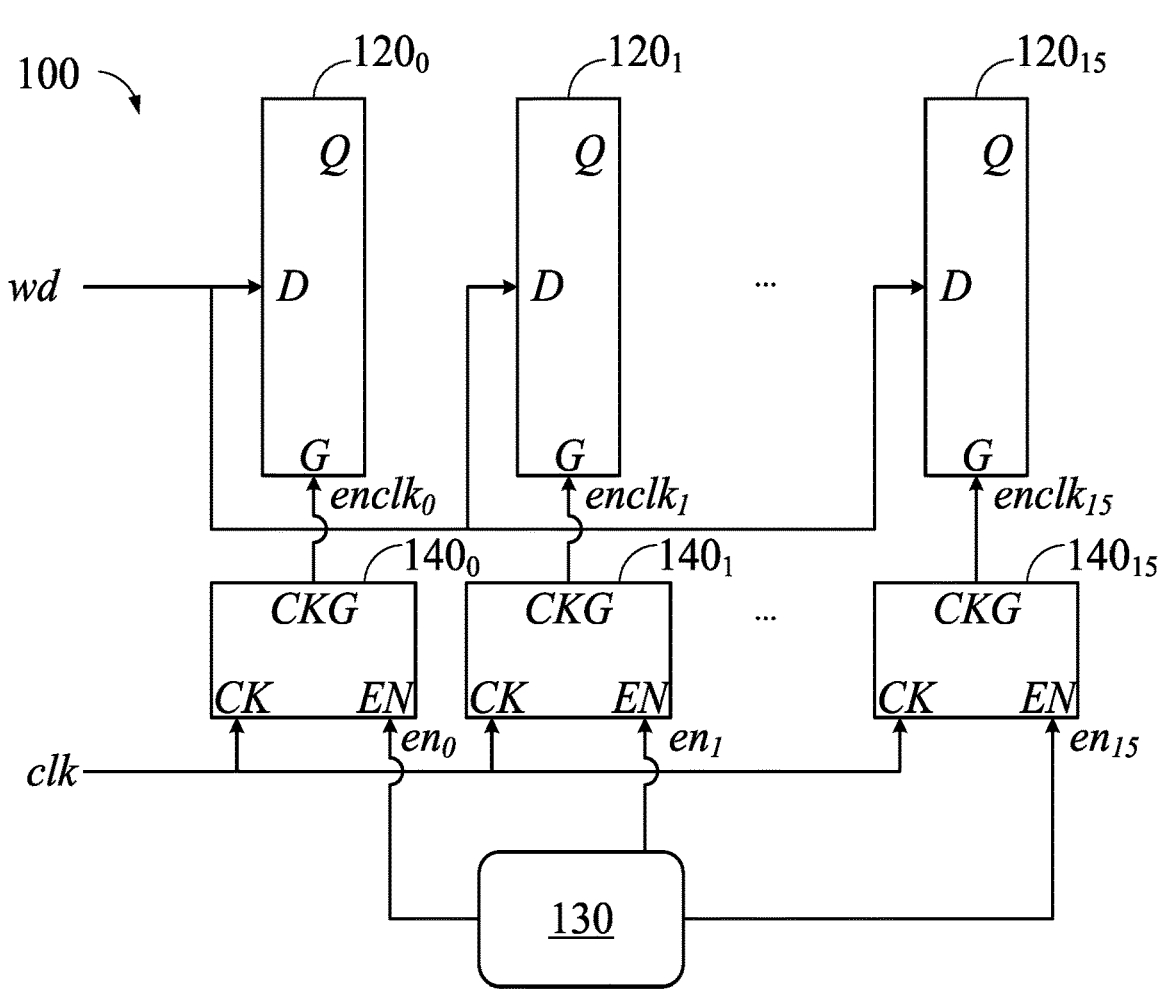
FIG. 4 shows a circuit diagram of a storage device according to some embodiments of the present disclosure.

FIG. 4 shows a storage device 100 according to some embodiments of the present disclosure. The storage device 100 includes a plurality of latch units $120_0$, $120_1$, . . . , $120_{15}$ (which sometimes may be collectively referred to as a latch unit $12_0$ herein). Each latch unit $12_0$ may have an input end D, an output end Q, and a clock control end G. These latch units $12_0$ each may be assigned with an address. These latch units $12_0$ may be arranged in a form of an array (for example, a one-dimensional array, a two-dimensional array, or the like). Although sixteen latch units are shown in FIG. 4, this is only exemplary rather than limiting. The present disclosure may be applicable to a storage device including any suitable number of latch units.

The input end D of each latch unit $12_0$ may be configured to receive write data wd. In view of the write data wd having been received at the input end D of each latch unit $12_0$, it can thus be controlled by the clock control end G of each latch unit $12_0$ whether to write the received write data wd into the latch unit $12_0$.

Therefore, the storage device 100 may further include a plurality of clock gating units $14_{00}$, $14_{01}$, . . . , $140_{15}$ (which sometimes may be collectively referred to as a clock gating unit 140 herein), each coupled to a respective latch unit $12_0$ (specifically, the clock control end G thereof). Each clock gating unit 140 may be configured to receive an input clock signal clk and an enable signal en obtained based on address decoding of a write address, and output an enable clock signal enclk to the clock control end G of respective one latch unit $12_0$, so that when the respective one latch unit $12_0$ corresponds to the write address, signal flipping occurs at the clock control end G thereof so as to write the write data wd thereinto, and when the respective one latch unit $12_0$ does not correspond to the write address, signal flipping does not occur at the clock control end G thereof so as not to write the write data wd thereinto.

Specifically, each clock gating unit 140 may have a clock end CK, an enable end EN, and an output end CKG. The clock end CK of each clock gating unit 140 may be configured to receive an input clock signal clk. The enable end EN of each clock gating unit 140 may be configured to receive an enable signal en ($en_0$, $en_1$, . . . , $en_{15}$) obtained based on address decoding of a write address. The output end CKG of each clock gating unit 140 may be configured to output an enable clock signal enclk ($enclk_0$, $enclk_1$, . . . , $enclk_{15}$) to the clock control end G of the respective one latch unit $12_0$. The storage device 100 may further include or be coupled to an address decoding unit 130 configured to perform address decoding on the write address to generate the enable signals $en_0$, $en_1$, . . . , $en_{15}$ which are respectively fed to the clock gating units $140_0$, $140_1$, . . . , $140_{15}$ to be combined with the input clock signal clk for generating the respective enable clock signals $enclk_0$, $enclk_1$, . . . , $enclk_{15}$, so as to control whether signal flipping occurs at the clock control ends G of the respective latch units $120_0$, $120_1$, . . . , $120_{15}$ to write the write data wd thereinto. For example, if it is assumed that the write address corresponds to the latch unit $120_0$, the enable signal $en_0$ is configured to be combined with the input clock signal clk for generating the enable clock signal $enclk_0$ so as to cause signal flipping to occur at the clock control end G of the latch unit $120_0$ so that the write data wd is written to the latch unit $120_0$, whereas the enable signals $en_1$, . . . , $en_{15}$ are configured to be combined with the input clock signal clk for generating the enable clock signals $enclk_1$, . . . , $enclk_{15}$ so as to cause signal flipping not to occur at the clock control ends G of the latch units $120_1$, . . . , $120_{15}$ so that the write data wd is not written to the latch units $120_1$, . . . , $120_{15}$.

In some embodiments, the clock gating unit 140 may include a latch and an AND gate. For example, with reference to FIG. 5, FIG. 5 shows a non-limiting implementation of the clock gating unit 140. As shown in FIG. 5, the clock gating unit 140 includes a latch 142 and an AND gate 144. The latch 142 receives an enable signal en and also receives and inverts an input clock signal clk to obtain an inverted input clock signal clki. The AND gate 144 receives the input clock signal clk and an enable latch signal enl outputted from the latch 142 and outputs an enable clock signal enclk. FIG. 6 shows an example waveform diagram of signals of the clock gating unit 140 of FIG. 5.

Figures 8, 9:
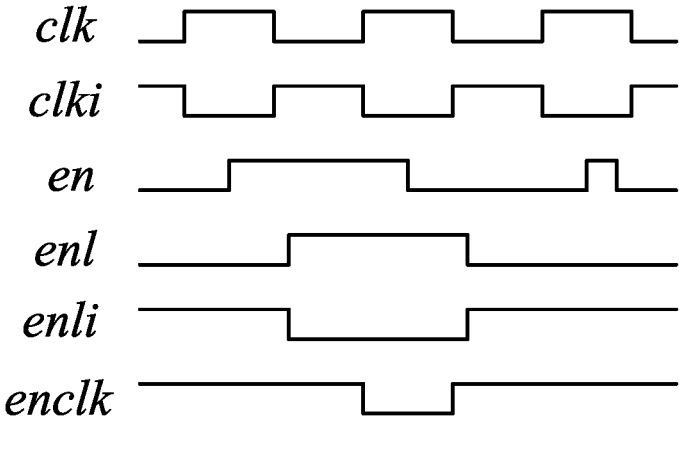
FIG. 8 shows an example waveform diagram of signals of the clock gating unit of FIG. 7.
FIG. 9 shows a circuit diagram of a clock gating unit according to some embodiments of the present disclosure.

In some other embodiments, the clock gating unit 140 may include a latch and an OR gate. For example, with reference to FIG. 7, FIG. 7 shows another non-limiting implementation of the clock gating unit 140. As shown in FIG. 7, the clock gating unit 140 includes a latch 142 and an OR gate 146. Inverters (or, NOT gates) 1482, 1484 are further provided at two input ends of the OR gate 146. The latch 142 receives an enable signal en and also receives and inverts an input clock signal clk to obtain an inverted input clock signal clki. The inverter 1482 inverts an enable latch signal enl outputted from the latch 142 to obtain an inverted enable latch signal enli. The inverter 1484 inverts the input clock signal clk to obtain an inverted input clock signal clki. The OR gate 146 receives the inverted input clock signal clki and the inverted enable latch signal enli and outputs an enable clock signal enclk. FIG. 8 shows an example waveform diagram of signals of the clock gating unit 140 of FIG. 7.

In yet other embodiments, the clock gating unit 140 may also only include an AND gate. For example, with reference to FIG. 9, FIG. 9 shows yet another non-limiting implementation of the clock gating unit 140. As shown in FIG. 9, the clock gating unit 140 includes only an AND gate 144. The AND gate 144 receives an input clock signal clk and an enable signal en and outputs an enable clock signal enclk.

With reference to FIG. 5, FIG. 7, and FIG. 9, it can be seen that the circuit implementation of the clock gating unit 140 is much simpler than that of the multiplexer unit 11 of FIG. 3. In particular, even if the clock gating unit 140 employs the latch 142, it is sufficient that the bit width of the latch is selected to be 1 bit. Compared to the multiplexer unit 11 which requires the same bit width as the latch unit 12, the area and power consumption of the clock gating unit 140 are significantly smaller. Therefore, compared to the storage device 10 of FIG. 3, the storage device 100 of FIG. 4 may have simplified data writing logic and also occupy less area and consume lower power consumption.

In addition, with the enable clock signal enclk generated by the clock gating unit 140, when a write operation is performed, signal flipping will only occur at the clock control end G of the latch unit 120 corresponding to the write address, and signal flipping will not occur at the clock control end G of the latch unit 120 not corresponding to the write address. Therefore, compared to the storage device 10 of FIG. 3, the storage device 100 of FIG. 4 may have a reduced flipping power consumption, thereby achieving a lower total chip power consumption.

Figure 10:
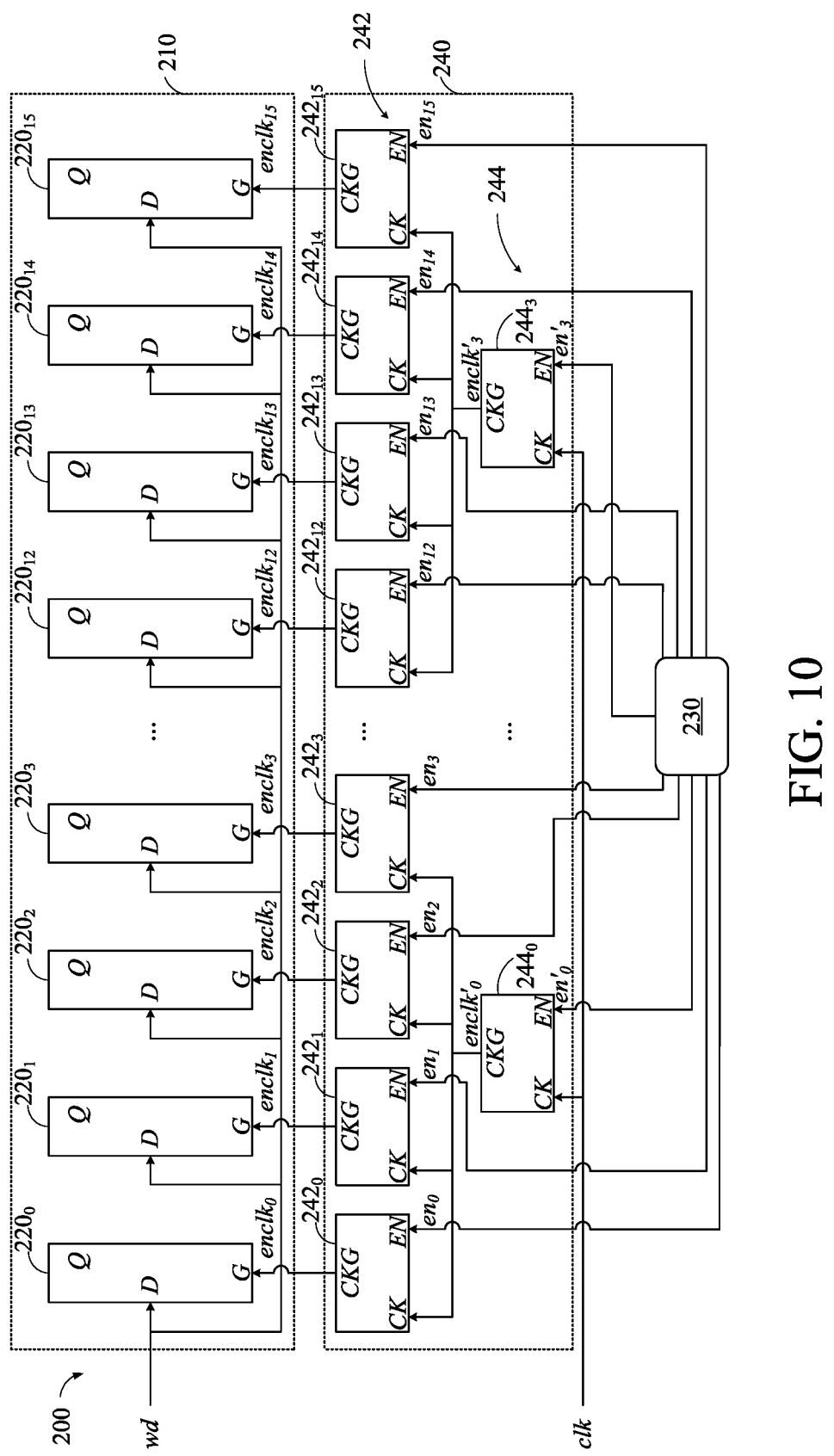
FIG. 10 shows a circuit diagram of a storage device according to some embodiments of the present disclosure.

It is worth noting that, when a write operation is performed, the clock ends CK of the respective clock gating units $140_0$, $140_1$, . . . , $140_{15}$ are also flipping, which will also bring about some power consumption. In contrast, FIG. 10 shows a storage device 200 according to some other embodiments of the present disclosure, which can achieve a further reduced signal flipping rate and thus a further reduced power consumption by arranging multiple stages of clock gating units. As shown in FIG. 10, the storage device 200 includes a storage module 210 and a clock gating module 240.

The storage module 210 includes a plurality of latch units $220_{00}$, $220_{01}$, . . . , $220_{15}$ (which sometimes may be collectively referred to as a latch unit 220 herein). Each latch unit 220 may have an input end D, an output end Q, and a clock control end G, and may be assigned with an address. These latch units 220 may be arranged in a form of an array (for example, a one-dimensional array, a two-dimensional array, or the like). Although sixteen latch units are shown in FIG. 10, this is only exemplary rather than limiting, and the present disclosure may be applicable to a storage device including any suitable number of latch units. An input end D of each latch unit 220 may be configured to receive write data wd.

The clock gating module 240 includes a first stage of clock gating units 244, and a second stage of clock gating units 242 coupled between the latch units $220_{00}$, $220_{01}$, . . . , $220_{15}$ and the first stage of clock gating units 244. As shown in FIG. 10, the first stage of clock gating units 244 may include a plurality of clock gating units $244_0$, $244_1$, . . . , $244_3$ (which sometimes may be collectively referred to as a clock gating unit 244 herein), and the second stage of clock gating units 242 may include a plurality of clock gating units $242_0$, $242_1$, . . . , $242_{15}$ (which sometimes may be collectively referred to as a clock gating unit 242 herein). Each clock gating unit of the first stage of clock gating units 244 is configured to receive an input clock signal clk and an enable signal en' ($en'_0$, . . . , $en'_3$) obtained based on first address decoding of a write address, and outputs an enable clock signal enclk' ($enclk'_0$, . . . , $enclk'_3$) to a respective clock gating unit of the second stage of clock gating units 242. Each clock gating unit of the second stage of clock gating units 242 is configured to receive an enable clock signal enclk' ($enclk'_0$, . . . , $enclk'_3$) outputted by a respective clock gating unit of the first stage of clock gating units 244 and an enable signal en ($en_0$, $en_1$, . . . , $en_{15}$) obtained based on second address decoding of the write address, and output an enable clock signal enclk ($enclk_0$, $enclk_1$, . . . , $enclk_{15}$) to a respective latch unit of the latch units $220_0$, $220_1$, . . . , $220_{15}$.

In the example shown in FIG. 10, the clock gating units $242_0$, $242_1$, . . . , $242_{15}$ are respectively coupled to the latch units $220_0$, $220_1$, . . . , $220_{15}$ in a one-to-one manner, the clock gating unit $244_0$ is coupled to the clock gating units $242_0$, $242_1$, $242_2$, $242_3$ and is thus coupled to the latch units $220_0$, $220_1$, $220_2$, $220_3$, the clock gating unit $244_1$ is coupled to the clock gating units $242_4$, $242_5$, $242_6$, $242_7$ and is thus coupled to the latch units $220_4$, $220_5$, $220_6$, $220_7$, the clock gating unit $244_2$ is coupled to the clock gating units $242_8$, $242_9$, $242_{10}$, $242_{11}$ and is thus coupled to the latch units $220_8$, $220_9$, $220_{10}$, $220_{11}$, and the clock gating unit $244_3$ is coupled to the clock gating units $242_{12}$, $242_{13}$, $242_{14}$, $242_{15}$ and is thus coupled to the latch units $220_{12}$, $220_{13}$, $220_{14}$, $220_{15}$.

Each clock gating unit 242, 244 may have a clock end CK, an enable end EN, and an output end CKG, where the clock end CK is configured to receive an input clock signal clk or an enable clock signal outputted by an upper stage of clock gating units, the enable end EN is configured to receive an enable signal obtained based on address decoding of a write address, and the output end CKG is configured to output an enable clock signal generated by the clock gating unit. Circuit implementations of the clock gating units 242, 244 may be similar to various circuit implementations of the clock gating unit 140 described above with reference to FIG. 5 to FIG. 9, which are not repeated herein.

The storage device 200 may further include or be coupled to an address decoding unit 230, which is configured to perform address decoding on a write address. The address decoding unit 230 may be configured to perform the first address decoding on the write address to generate the enable signals $en'_0$, ..., $en'_3$, which are respectively fed to the first stage of clock gating units $244_0$, ..., $244_3$ to be combined with the input clock signal clk for generating respective enable clock signals $enclk'_0$, ..., $enclk'_3$, thereby controlling whether signal flipping occurs at the clock ends CK of the respective second stage of clock gating units $242_0$, $242_1$, ..., $242_{15}$. The address decoding unit 230 may also be configured to perform the second address decoding on the write address to generate the enable signals $en_0$, $en_1$, ..., $en_{15}$, which are respectively fed to the second stage of clock gating units $242_0$, $242_1$, ..., $242_{15}$ to be combined with the respective enable clock signals $enclk'_0$, ..., $enclk'_3$ for generating respective enable clock signals $enclk_0$, $enclk_1$, ..., $enclk_{15}$, thereby controlling whether signal flipping occurs at the clock control ends G of the respective latch units $220_0$, $220_1$, ..., $220_{15}$.

Herein, for convenience of description, a latch unit corresponding to a write address may be referred to as a target latch unit, and a latch unit not corresponding to the write address may be referred to as a non-target latch unit. Therefore, the enable signals ($en'_0$, ..., $en'_3$) obtained based on the first address decoding of the write address may be configured so that an enable clock signal outputted by a clock gating unit of the first stage of clock gating units 244 that is not coupled to a target latch unit causes signal flipping not to occur at a clock end CK of a clock gating unit of the second stage of clock gating units 242 that is coupled to the clock gating unit, and so that an enable clock signal outputted by a clock gating unit of the first stage of clock gating units 244 that is coupled to the target latch unit causes signal flipping to occur at a clock end CK of a clock gating unit of the second stage of clock gating units 242 that is coupled to the clock gating unit. The enable signals ($en_0$, $en_1$, ..., $en_{15}$) obtained based on the second address decoding of the write address may be configured so that signal flipping occurs at a clock control end G of the target latch unit and signal flipping does not occur at a clock control end G of the non-target latch unit, so that the write data wd is written to the target latch unit and the write data wd is not written to the non-target latch unit.

For example, in FIG. 10, if it is assumed that a target latch unit is the latch unit $220_0$, the enable signal $en'_0$ may be at a high level (for example, 1) so that signal flipping occurs at the respective clock ends CK of the clock gating units $242_0$, $242_1$, $242_2$, $242_3$ (the clock is turned on for one cycle), and the enable signals $en'_1$, $en'_2$, $en'_3$ may be at a low level (for example, 0), so that signal flipping does not occur at the respective clock ends CK of the clock gating units $242_4$, $242_5$, ..., $242_{15}$ (the clock is turned off). Since signal flipping does not occur at the respective clock ends CK of the clock gating units $242_4$, $242_5$, ..., $242_{15}$, enable clock signals $enclk_4$, $enclk_5$, ..., $enclk_{15}$ outputted by the output ends CKG thereof may be at a low level (for example, 0), so that signal flipping does not occur at the respective clock control ends G of the latch units $220_4$, $220_5$, ..., $220_{15}$ (the clock is turned off). In addition, the enable signal $en_0$ may be at a high level (for example, 1) so that signal flipping occurs at the clock control end G of the latch unit $220_0$ (the clock is turned on for one cycle), and the enable signals $en_1$, $en_2$, $en_3$ may be at a low level (for example, 0) so that signal flipping does not occur at the respective clock control ends G of the latch units $220_1$, $220_2$, $220_3$ (the clock is turned off). In this way, although the input ends D of the latch units $220_0$, $220_1$, ..., $220_{15}$ all receive the write data wd, the write data wd is written to only the latch unit $220_0$ and is not written to the latch units $220_1$, $220_2$, ..., $220_{15}$ due to the fact that signal flipping only occurs at the clock control end G of the latch unit $220_0$.

Also for the purpose of writing the write data wd to one latch unit $220_0$ ($120_0$), signal flipping occurs at the clock ends CK of only eight clock gating units (clock gating units $242_0$, $242_1$, $242_2$, $242_3$, $244_0$, $244_1$, $244_2$, $244_3$) of the storage device 200, whereas signal flipping occurs at the clock ends CK of sixteen clock gating units (clock gating units $140_0$, $140_1$, ..., $140_{15}$) of the storage device 100. Therefore, when a write operation is performed, the storage device 200 has a significantly reduced signal flipping rate and therefore a significantly reduced flipping power consumption compared to the storage device 100, thereby achieving a reduced total chip power consumption. In addition, although a number of clock gating units of the storage device 200 is increased compared to the storage device 100, as described above, the circuit implementation of the clock gating units used thereby is simple and occupies less area, and therefore cost of such increase in number is acceptable compared to its benefits.

In some embodiments, the clock gating module 240 may further include one or more stages of clock gating units coupled between the first stage of clock gating units 244 and the second stage of clock gating units 242. Each clock gating unit of each stage of clock gating units of the one or more stages of clock gating units may be configured to receive an enable clock signal outputted by a respective clock gating unit of an upper stage of clock gating units (at a side close to the first stage of clock gating units 244) of the one or more stages of clock gating units and an enable signal obtained based on respective address decoding of the write address, and output an enable clock signal to a respective clock gating unit of a lower stage of clock gating units (at a side close to the second stage of clock gating units 242) of the one or more stages of clock gating units. In this case, each clock gating unit of the first stage of clock gating units 244 is configured to receive the input clock signal and the enable signal obtained based on the first address decoding of the write address and output an enable clock signal to a respective clock gating unit of a uppermost stage of clock gating units (directly coupled to the first stage of clock gating units 244) of the one or more stages of clock gating units, and each clock gating unit of the second stage of clock gating units 242 is configured to receive an enable clock signal outputted by a respective clock gating unit of a lowermost stage of clock gating units (directly coupled to the second stage of clock gating units 242) of the one or more stages of clock gating units and the enable signal obtained based on the second address decoding of the write address and output an enable clock signal to the respective latch unit. For example, FIG. 11 shows a clock gating module 240 including three stages of clock gating units (the enable signals are not shown), where the clock gating module 240 further includes a third stage of clock gating units 246 coupled between the first stage of clock gating units 244 and the second stage of clock gating units 242, which includes a plurality of clock gating units $246_0$, $246_1$, . . . , $246_7$.

A number of stages in the clock gating module 240 may be determined in the following manner. The latch units $220_0$, $220_1$, . . . , $220_{15}$ may be grouped at levels, where groups obtained from grouping the latch units $220_0$, $220_1$, . . . , $220_{15}$ at each level are obtained by further dividing groups obtained from grouping the latch units $220_0$, $220_1$, . . . , $220_{15}$ at an upper level. In this case, the number of stages of clock gating units included in the clock gating module 240 may correspond to a number of levels for grouping the latch units $220_0$, $220_1$, . . . , $220_{15}$, and a number of clock gating units included in each stage of clock gating units in the clock gating module 240 may also correspond to a number of groups obtained from grouping the latch units $220_0$, $220_1$, . . . , $220_{15}$ at a respective level.

For example, with reference to FIG. 10, the latch units $220_0$, $220_1$, . . . , $220_{15}$ may be grouped at two levels. At an upper level (a first level), the latch units $220_0$, $220_1$, . . . , $220_{15}$ are grouped into four groups, each including four latch units (a first group includes the latch units $220_0$, $220_1$, $220_2$, $220_3$, a second group includes the latch units $220_4$, $220_5$, $220_6$, $220_7$, a third group includes the latch units $220_8$, $220_9$, $220_{10}$, $220_{11}$, and a fourth group includes the latch units $220_{12}$, $220_{13}$, $220_{14}$, $220_{15}$). At a lower level (a second level), the latch units $220_0$, $220_1$, . . . , $220_{15}$ are grouped into sixteen groups, each including one latch unit (each group includes one latch unit 220 of $220_0$, $220_1$, . . . , $220_{15}$, respectively). In view of that the latch units $220_0$, $220_1$, . . . , $220_{15}$ are grouped at two levels, the clock gating module 240 may include two stages of clock gating units, namely, a first stage of clock gating units 244 (corresponding to the first level, and including four clock gating units) and a second stage of clock gating units 242 (corresponding to the second level, and including sixteen clock gating units). In the case of FIG. 11, the latch units $220_0$, $220_1$, . . . , $220_{15}$ are grouped at three levels, in comparison with FIG. 10, which further include the latch units $220_0$, $220_1$, . . . , $220_{15}$ at an intermediate level (a third level) being grouped into eight groups, each including two latch units. In view of this, the clock gating module 240 of FIG. 11 may include three stages of clock gating units, i.e., further includes a third stage of clock gating units 246 (corresponding to the third level, and including eight clock gating units).

Figure 11:
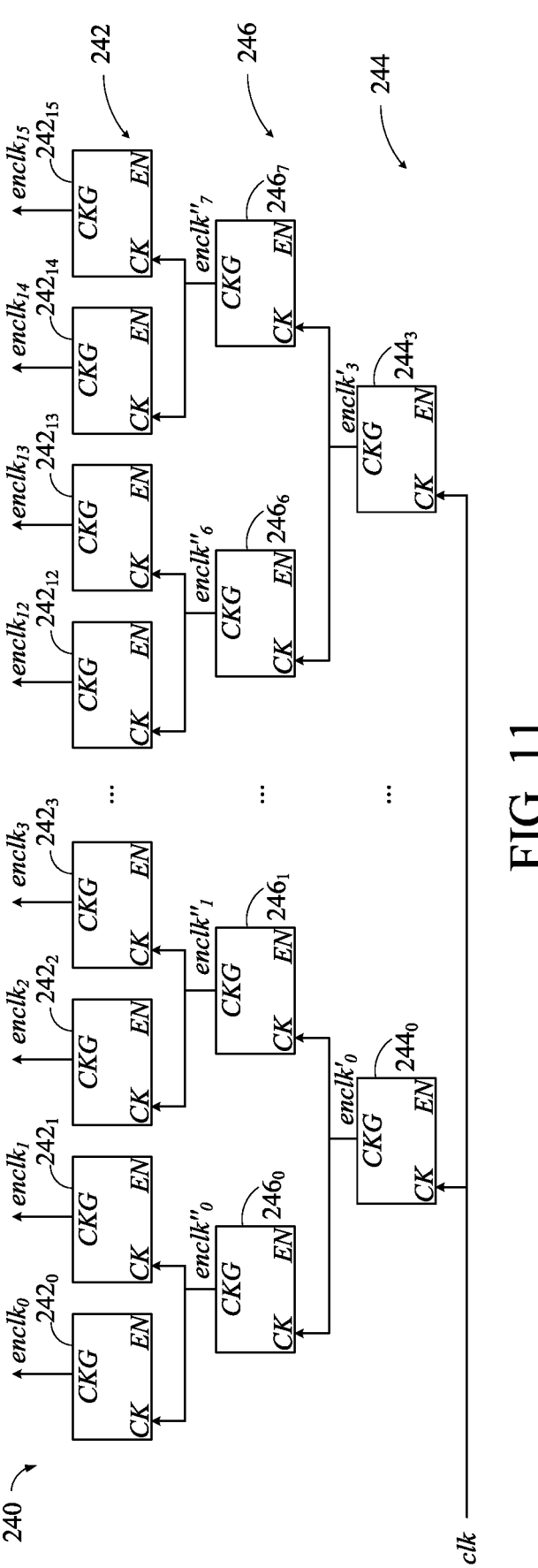
FIG. 11 shows a circuit diagram of a clock gating module according to some embodiments of the present disclosure.

It may be understood that although in the exemplary examples of FIG. 10 and FIG. 11, the latch units $220_0$, $220_1$, . . . , $220_{15}$ are equally divided at each level; this does not imply limitation. For each level, a number of latch units included in each group obtained from grouping the latch units $220_0$, $220_1$, . . . , $220_{15}$ at the level may be the same or different. That is, the dividing is not particularly limited, as long as the groups obtained from grouping the latch units at each level is obtained by further dividing the groups obtained from grouping the latch units at an upper level.

Each clock gating unit of each stage of clock gating units in the clock gating module 240 may be directly or indirectly coupled to respective one group of latch units obtained from grouping the latch units $220_0$, $220_1$, . . . , $220_{15}$ at a respective level. For example, as shown in FIG. 10, each clock gating unit of the first stage of clock gating units 244 is coupled, via other stage of clock gating units in the clock gating module 240, to respective one group of latch units obtained from grouping the latch units $220_0$, $220_1$, . . . , $220_{15}$ at the first level, and each clock gating unit of the second stage of clock gating units 242 is coupled to respective one group of latch units obtained from grouping the latch units $220_0$, $220_1$, . . . , $220_{15}$ at the second level. In some embodiments as shown in FIG. 10, the groups obtained from grouping the latch units $220_0$, $220_1$, . . . , $220_{15}$ at the second level each include one latch unit, and correspondingly each clock gating unit of the second stage of clock gating units 242 is coupled to one latch unit; and the groups obtained from grouping the latch units $220_0$, $220_1$, . . . , $220_{15}$ at the first level each include four latch units, and correspondingly each clock gating unit of the first stage of clock gating units 244 is coupled, via other stage of clock gating units in the clock gating module 240, to four latch units. If a first clock gating unit (for example, the clock gating unit $244_0$) included in the first stage of clock gating units 244 is coupled to a second clock gating unit (for example, the clock gating unit $242_0$) included in the second stage of clock gating units 242, respective one group of latch units (for example, the latch units $220_0$, $220_1$, $220_2$, $220_3$) coupled to the first clock gating unit (for example, the clock gating unit $244_0$) includes respective one group of latch units (for example, the latch unit $220_0$) coupled to the second clock gating unit (for example, the clock gating unit $242_0$), that is, a group of latch units (for example, the latch unit $220_0$) corresponding to the second clock gating unit (for example, the clock gating unit $242_0$) at the second level is a subgroup of a group of latch units (for example, the latch units $220_0$, $220_1$, $220_2$, $220_3$) corresponding to the first clock gating unit (for example, the clock gating unit $244_0$) at the first level.

The enable signal received by each clock gating unit of each stage of clock gating units in clock gating module 240 may be obtained based on address decoding of the write address corresponding to a respective level. In some embodiments, an address of each latch unit of the latch units $220_0$, $220_1$, . . . , $220_{15}$ includes different parts corresponding to different levels. Addresses of latch units in a same group at a same level may, for example, have a same part.

In some examples, when the address is binary, if the groups obtained from grouping the latch units at the second level each include one latch unit (sixteen groups in total) and the groups obtained from grouping the latch units at the first level each include four latch units (four groups in total), the first address decoding of the write address corresponding to the first level may be associated with bits other than two lowest bits of the write address, and the second address decoding of the write address corresponding to the second level may be associated with the two lowest bits of the write address. For example, with reference to FIG. 10, if it is assumed that the latch units $220_0$, $220_1$, . . . , $220_{15}$ are respectively assigned with addresses 0000 to 1111, where an address range of the latch units $220_0$, $220_1$, $220_2$, $220_3$ is 0000 to 0011 (which belong to the same group at the first level, and each have an address with two highest bits being 00), an address range of the latch units $220_4$, $220_5$, $220_6$, $220_7$ is 0100 to 0111 (which belong to the same group at the first level, and each have an address with two highest bits being 01), an address range of the latch units $220_8$, $220_9$, $220_{10}$, $220_{11}$ is 1000 to 1011 (which belong to the same group at the first level, and each have an address with two highest bits being 10), and an address range of the latch units $220_{12}$, $220_{13}$, $220_4$, $220_{15}$ is 1100 to 1111 (which belong to the same group at the first level, and each have an address with two highest bits being 11). Then, when the write address is 0000 (the target latch unit is the latch unit $220_0$), the first address decoding of the write address corresponding to the first level may be based on the two highest bits of the write address, 00, so that the enable signal en'$_0$ for the clock gating unit $244_0$ is at a high level, and the enable signals en'$_1$, en'$_2$, en's for the clock gating unit $244_1$, $244_2$, $244_3$ are at a low level. Therefore, only the clock ends CK of the clock gating units $242_0$, $242_1$, $242_2$, $242_3$ are turned on. Next, the second address decoding of the write address corresponding to the second level may be based on the two lowest bits of the write address, 00, so that the enable signal en$_0$ for the clock gating unit $242_0$ is at a high level, and the enable signals en$_1$, en$_2$, en$_3$ for the clock gating units $242_1$, $242_2$, $242_3$ are at a low level. Therefore, only the clock control end G of the latch unit $220_0$ is turned on.

Similarly, in some other examples, when the address is binary, if the groups obtained from grouping the latch units at the second level each include one latch unit (sixteen groups in total) and the groups obtained from grouping the latch units at the first level each include eight latch units (two groups in total), the first address decoding of the write address corresponding to the first level may be associated with bits other than three lowest bits of the write address, and the second address decoding of the write address corresponding to the second level may be associated with the three lowest bits of the write address. For example, it is assumed that the latch units $220_0$, $220_1$, . . . , $220_{15}$ are respectively assigned with addresses 0000 to 1111, where the latch units $220_0$, $220_1$, . . . , $220_7$ are grouped into one group at the first level and have an address range being 0000 to 0111 (each having an address with a highest bit being 0), and the latch units $220_8$, $220_9$, . . . , $220_{15}$ are grouped into one group at the first level and have an address range being 1000 to 1111 (each having an address with a highest bit being 1).

It may be understood that for a binary address, when the latch units are grouped at a plurality of levels, address decoding of a write address corresponding to each level may be associated with respective several bits of the write address. "Several" means that there may be one or more. In some embodiments, especially when the latch units are equally divided at each level, a number of bits of the respective several bits may be decided by a number of bits of a binary representation of a ratio of a number of groups obtained from grouping the latch units at the level to a number of groups obtained from grouping the latch units at an upper level. For the uppermost level, an upper level thereof may be considered as being not grouped, or a number of groups obtained from grouping the latch units at the upper level thereof may be considered as one.

For example, when the latch units are grouped at two levels, a number of bits of a binary representation of a number of groups obtained from grouping the latch units at the first level (a ratio of which to one) decides how many highest bits of the write address are associated with the first address decoding of the write address corresponding to the first level, and a number of bits of a binary representation of a ratio of a number of groups obtained from grouping the latch units at the lower second level to the number of groups obtained from grouping the latch units at the first level decides how many lowest bits of the write address are associated with the second address decoding of the write address corresponding to the second level. For example, in the above-described example in which the groups obtained from grouping the latch units at the second level each include one latch unit (sixteen groups in total) and the groups obtained from grouping the latch units at the first level each include eight latch units (two groups in total): the number of groups obtained from grouping the latch units at the first level (a ratio of which to one) is 2 with a binary representation being 1 (a number of bits is 1), thus the address decoding of the write address corresponding to the first level is associated with one highest bit of the write address; a ratio of the number of groups obtained from grouping the latch units at the second level to the number of groups obtained from grouping the latch units at the first level is 8 with a binary representation being 111 (a number of bits is 3), thus the address decoding of the write address corresponding to the second level is associated with three lowest bits of the write address. Still for example, in the above-described example in which the groups obtained from grouping the latch units at the second level each include one latch unit (16 sixteen in total) and the groups obtained from grouping the latch units at the first level each include four latch units (four groups in total): the number of groups obtained from grouping the latch units at the first level (a ratio of which to one) is 4 with a binary representation being 11 (a number of bits is 2), thus the address decoding of the write address corresponding to the first level is associated with two highest bits of the write address; a ratio of the number of groups obtained from grouping the latch units at the second level to the number of groups obtained from grouping the latch units at the first level is 4 with a binary representation being 11 (a number of bits is 2), the address decoding of the write address corresponding to the second level is associated with two lowest bits of the write address.

Through the address configuration described above, the address decoding logic can be simplified. Certainly, the configuration of the address is not limited to the examples described above, but may take any form suitable for addressing to the group in which the target latch unit is located at each level. Therefore, an enable signal based on address decoding of a write address corresponding to each level may be used for enabling a clock gating unit of a respective stage of clock gating units corresponding to a group in which the target latch unit is located at the level.

Figure 12:
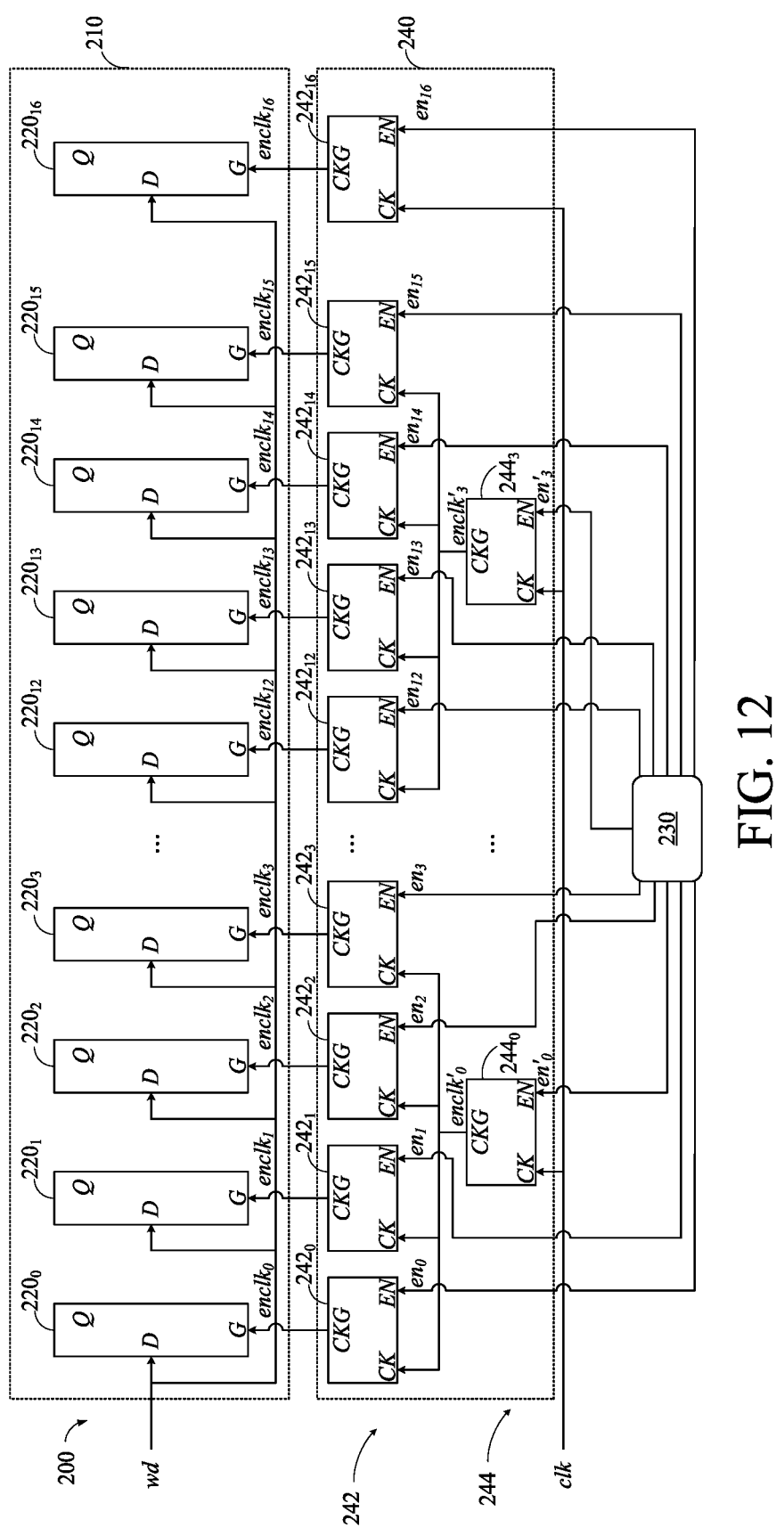
FIG. 12 shows a circuit diagram of a storage device according to some embodiments of the present disclosure.

With reference to FIG. 12, in some embodiments, the storage module 210 further includes an additional latch unit 22016 and the clock gating module 240 further includes an additional clock gating unit 24216. The additional latch unit 22016 may be assigned with an address, and an input end D thereof is also configured to receive the write data. The additional clock gating unit 24216 is coupled to the additional latch unit 22016 and is configured to receive the input clock signal clk and an enable signal en$_{16}$ obtained based on address decoding of the write address and output an enable clock signal enclk$_{16}$ to the additional latch unit 22016. In such the embodiments, there may be a latch unit not grouped after grouping the latch units in the storage module 210 at the uppermost level. For example, one latch unit is left after grouping seventeen latch units in a manner in which each group has four latch units (as shown in FIG. 12). In this case, it is not necessary and may even be disadvantageous to separately arrange multiple stages of clock gating units for the latch unit not grouped. Therefore, data writing of the not grouped latch unit may be directly controlled using a single clock gating unit, a case of which is similar to each latch unit 120 and the corresponding clock gating unit 140 thereof in FIG. 4.

Figures 13, 14:
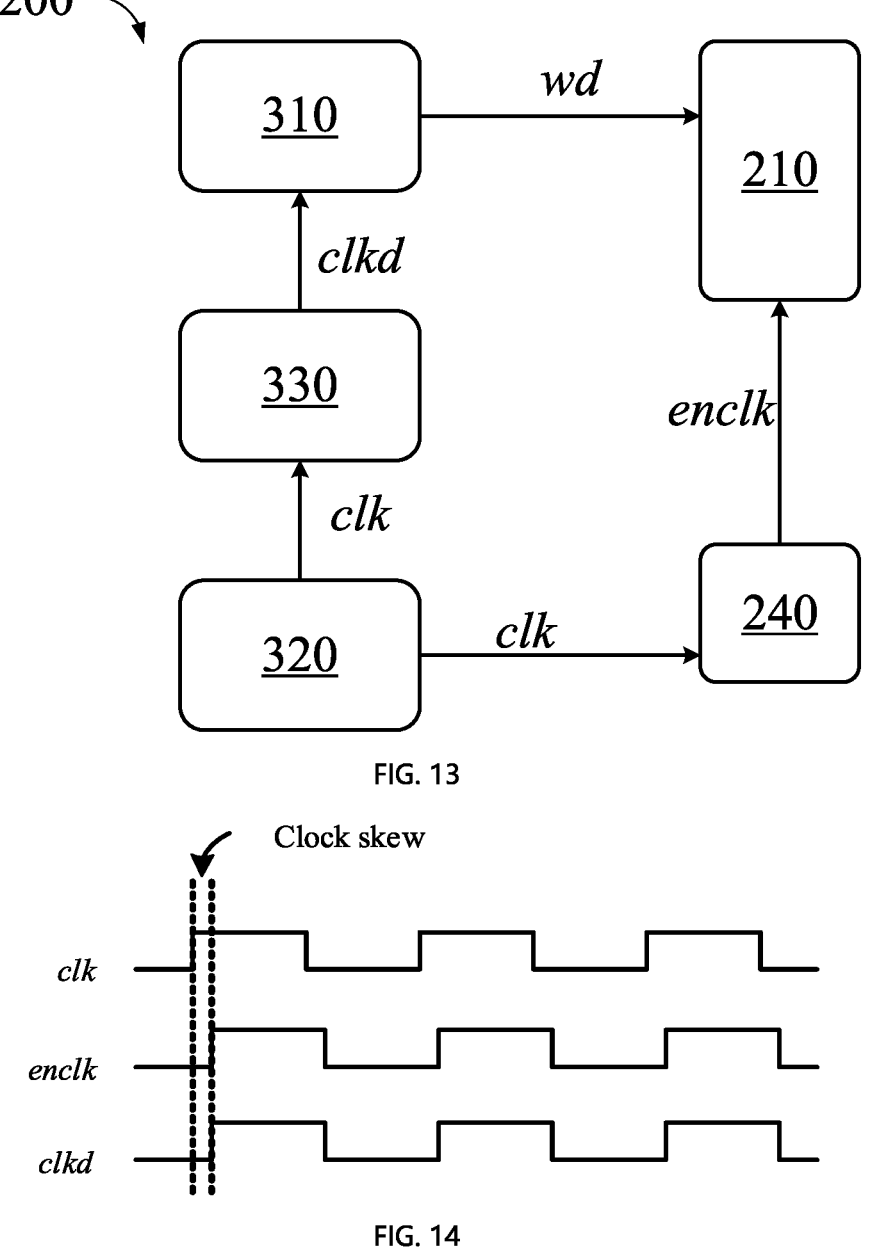
FIG. 13 shows a schematic block diagram of a storage device according to some embodiments of the present disclosure.
FIG. 14 shows an example waveform diagram of some signals of the storage device of FIG. 13.

In addition, with reference to FIG. 13 and FIG. 14, the storage device 200 may further include a flip-flop unit 310 and a clock source unit 320. The flip-flop unit 310 may be configured to output the write data wd to the storage module 210 based on a received clock signal. The clock source unit 320 is coupled to the flip-flop unit 310 and the clock gating module 240, respectively, and is configured to provide an input clock signal clk. As shown in FIG. 14, due to the presence of the multiple stages of clock gating units in the clock gating module 240, there may be a delay (or referred to as "clock skew") in the enable clock signal enclk received by the target latch unit corresponding to the write address in the storage module 210 relative to the input clock signal clk, and such delay may cause problems in the timing of output of wd by the flip-flop unit 310 and writing of wd in the storage module 210, thereby probably causing a writing failure. In view of this, as shown in FIG. 13, in some embodiments, the storage device 200 may further include a clock delay unit 330 coupled between the clock source unit 320 and the flip-flop unit 310. The clock delay unit 330 is configured to receive the input clock signal clk, delay the input clock signal clk based on a delay of the enable clock signal enclk received by the target latch unit in the storage module 210 relative to the input clock signal clk, and output a delayed input clock signal clkd to the flip-flop unit 310. As shown in FIG. 14, the clock skew between the delayed input clock signal clkd and the enable clock signal enclk may be absent or very small. The clock delay unit 320 may include, for example, one or more of the following: a clock buffer; and an inverter. In some embodiments the clock delay unit 320 may include a cascade of a plurality of clock buffers or inverters. When the flip-flop unit 310 is triggered by a rising edge, a rising edge of the delayed input clock signal clkd may be closer to a rising edge of the enable clock signal enclk received by the target latch unit in the storage module 210 compared with a rising edge of the input clock signal clk. When the flip-flop unit 310 is triggered by a falling edge, a falling edge of the delayed input clock signal clkd may be closer to a falling edge of the enable clock signal enclk received by the target latch unit in the storage module 210 compared with a falling edge of the input clock signal clk. By providing the clock delay unit 330, the timing of the storage device 200 can be optimized and the performance can be further improved.

In another aspect, the present disclosure further provides a system-on-chip which may include the storage device according to any of the embodiments described above. For example, such system-on-chip may be implemented as a variety of processors, controllers, or the like.

In yet another aspect, the present disclosure further provides a computing apparatus which may include the system-on-chip according to any of the embodiments described above. Examples of the computing device may include but are not limited to a consumer electronic product, a component of a consumer electronic product, an electronic test device, and cellular communications infrastructure such as a base station. Examples of the computing device may include but are not limited to a mobile phone such as a smartphone, a wearable computing device such as a smartwatch or a headset, a telephone, a television, a computer monitor, a computer, a modem, a handheld computer, a laptop computer, a tablet computer, a personal digital assistant (PDA), a microwave oven, a refrigerator, an in-vehicle electronic system such as an automotive electronic system, a stereo system, a DVD player, a CD player, a digital music player such as an MP3 player, a radio receiver, a camcorder, a camera such as a digital camera, a portable memory chip, a washing machine, a dryer, a washing machine/dryer, a peripheral device, and a clock. Moreover, the computing device may include an incomplete product.

The terms "left", "right", "front", "rear", "top", "bottom", "above", "under", "upper", "lower", and the like in the specification and the claims, if present, are used for a descriptive purpose and are not necessarily used for describing an unchanged relative position. It is to be understood that the words used in such a way are interchangeable in proper circumstances so that the embodiments of the present disclosure described herein, for example, can be operated in other orientations that are different from those shown herein or those described otherwise. For example, when the device in the accompanying drawings is turned upside down, a feature originally described as being "above" another feature may be described as being "under" another feature in this case. The device may alternatively be oriented in other manners (rotated 90 degrees or in other orientations). In this case, a relative spatial relationship will be interpreted correspondingly.

In the specification and the claims, when an element is referred to as being "above" another element, "attached" to another element, "connected" to another element, "coupled" to another element, "in contact" with another element, or the like, the element may be directly above the another element, directly attached to the another element, directly connected to the another element, directly coupled to the another element, or directly in contact with the another element; or one or more intermediate elements may exist. In contrast, when an element is referred to as being "directly above" another element, "directly attached" to another element, "directly connected" to another element, "directly coupled" to another element, or "in direct contact" with another element, no intermediate element exists. In the specification and the claims, a feature being arranged as being "adjacent" to another feature may mean that the feature has a part that overlaps with the adjacent feature or that is located above or under the adjacent feature.

As used herein, the term "exemplary" means "used as an example, instance, or illustration", and not as a "model" to be accurately copied. Any implementation exemplarily described herein is not necessarily to be construed as preferred or advantageous over other implementations. In addition, the present disclosure is not limited by any stated or implied theory provided in the technical field, background, summary, or detailed description.

As used herein, the term "substantially" means that any minor variation caused by a defect of a design or manufacturing, a tolerance of a device or an element, environmental impact, and/or other factors is included. The term "substantially" also allows for a difference from a perfect or ideal situation caused by parasitic effect, noise, and other practical consideration factors that may exist in practical implementation.

In addition, terms like "first" and "second" may also be used herein for a reference purpose only, and therefore are not intended for a limitation. For example, the terms "first", "second" and other such numerical terms relating to a structure or an element do not imply a sequence or an order unless the context clearly indicates otherwise.

It is to be further understood that the term "comprise/include", when used herein, specifies the presence of stated features, integers, steps, operations, units, and/or components, but do not preclude the presence or addition of one or more other features, integers, steps, operations, units, and/or components, and/or combinations thereof.

In addition, when used in this application, the terms "herein", "foregoing", "following", "hereinafter", and "hereinabove" and terms of similar meanings shall refer to the entirety of this application but not any specific part of this application. Moreover, unless otherwise stated clearly or interpreted in other manners in the context used, conditional language such as "may", "can", "for example", and "such as" used herein are usually intended to indicate that some embodiments include certain features, elements, and/or states but other embodiments do not. Therefore, such conditional language are usually not intended to imply that features, elements, and/or states are required in any manner in one or more embodiments, or imply whether these features, elements, and/or states are included, or imply that these features, elements, and/or states are implemented in any specific embodiment.

In the present disclosure, the term "provide" is used broadly for covering all manners of obtaining an object. Therefore, "providing an object" includes but is not limited to "purchasing", "preparing/manufacturing", "arranging/setting", "installing/assembling", and/or "ordering" the object, etc.

As used herein, the term "and/or" includes any and all combinations of one or more of associated listed items. The terms used herein are merely for the purpose of describing specific embodiments but not intended to limit the present disclosure. The singular forms "a", "an", and "the" as used herein are intended to include plural forms as well, unless otherwise clearly stated in the context.

A person skilled in the art should appreciate that the boundaries between the operations as described above are merely illustrative. A plurality of operations may be combined into a single operation, a single operation may be distributed in an additional operation, and operations may be performed at least partially overlapping in time. In addition, alternative embodiments may include a plurality of instances of a specific operation, and an operation order may be changed in various other embodiments. Other modifications, changes, and replacements, however, are also possible. Aspects and elements of all embodiments disclosed above may be combined in any manner and/or combined with aspects or elements of other embodiments to provide a plurality of additional embodiments. Therefore, the specification and the accompanying drawings are to be regarded as illustrative rather than restrictive. In practice, the novel device, method, and system described herein may be embodied in various other forms. Moreover, various omissions, replacements, and changes may be made to the forms of the method and the system described herein without departing from the spirit of the present disclosure. For example, although blocks are shown in a given arrangement, in alternative embodiments, similar functions with different components and/or circuit topologies may be performed, and some blocks may be removed, moved, added, subdivided, combined, and/or modified. Each of these blocks may be implemented in various different manners.

Each embodiment of the present disclosure may be described in a progressive manner. For same or similar parts between each embodiment, can refer to each other. Descriptions of each embodiment focus on a difference from other embodiments. In the present disclosure, descriptions with reference to the term "an embodiment", "some embodiments", "an example", "a specific example", "some examples", or the like mean that specific features, structures, materials, or characteristics described in conjunction with the embodiment or example are included in at least one embodiment or example of the present disclosure. In the present disclosure, exemplary descriptions of the foregoing terms do not necessarily refer to a same embodiment or example. In addition, the described specific features, structures, materials, or characteristics may be combined in proper manners in any one or more embodiments or examples.

Although some specific embodiments of the present disclosure are described in detail by examples, a person skilled in the art is to understand that the foregoing examples are merely used for description, but not for limiting the scope of the present disclosure. Each embodiment disclosed herein may be combined in any combination without departing from the spirit and scope of the present disclosure. A person skilled in the art is to further understand that various modifications may be made to the embodiments without departing from the scope and spirit of the present disclosure. The scope of the present disclosure is defined by the appended claims.

What is claimed is:

1. A storage device comprising:

a storage module comprising a plurality of latch units each being assigned with an address, an input end of each of the plurality of latch units being configured to receive write data; and a clock gating module comprising a first stage of clock gating units and a second stage of clock gating units coupled between the plurality of latch units and the first stage of clock gating units, wherein each clock gating unit of the first stage of clock gating units is configured to receive an input clock signal and an enable signal obtained based on first address decoding of a write address and output an enable clock signal to a respective clock gating unit of the second stage of clock gating units, and each clock gating unit of the second stage of clock gating units is configured to receive an enable clock signal outputted by a respective clock gating unit of the first stage of clock gating units and an enable signal obtained based on second address decoding of the write address and output an enable clock signal to a respective latch unit of the plurality of latch units.

2. The storage device according to claim 1, wherein the clock gating module further comprises one or more stages of clock gating units coupled between the first stage of clock gating units and the second stage of clock gating units, and each clock gating unit of each stage of clock gating units of the one or more stages of clock gating units is configured to receive an enable clock signal outputted by a respective clock gating unit of an upper stage of clock gating units of the one or more stages of clock gating units and an enable signal obtained based on respective address decoding of the write address and output an enable clock signal to a respective clock gating unit of a lower stage of clock gating units of the one or more stages of clock gating units, wherein each clock gating unit of the first stage of clock gating units is configured to receive the input clock signal and the enable signal obtained based on the first address decoding of the write address and output the enable clock signal to a respective clock gating unit of an uppermost stage of clock gating units of the one or more stages of clock gating units, and each clock gating unit of the second stage of clock gating units is configured to receive an enable clock signal outputted by a respective clock gating unit of a lowermost stage of clock gating units of the one or more stages of clock gating units and the enable signal obtained based on the second address decoding of the write address and output the enable clock signal to the respective latch unit of the plurality of latch units.

3. The storage device according to claim 2, wherein plurality of latch units are grouped at levels, and groups obtained from grouping the plurality of latch units at each level is obtained by further dividing groups obtained from grouping the plurality of latch units at an upper level, wherein a number of stages of clock gating units comprised in the clock gating module corresponds to a number of levels for grouping the plurality of latch units, and wherein a number of clock gating units comprised in each stage of clock gating units in the clock gating module corresponds to a number of groups obtained from grouping the plurality of latch units at a respective level.

4. The storage device according to claim 1, wherein the plurality of latch units are grouped at levels, and groups obtained from grouping the plurality of latch units at each level is obtained by further dividing groups obtained from grouping the plurality of latch units at an upper level, wherein a number of stages of clock gating units comprised in the clock gating module corresponds to a number of levels for grouping the plurality of latch units, and wherein a number of clock gating units comprised in each stage of clock gating units in the clock gating module corresponds to a number of groups obtained from grouping the plurality of latch units at a respective level.

5. The storage device according to claim 4, wherein the enable signal received by each clock gating unit of each stage of clock gating units in the clock gating module is obtained based on address decoding of the write address corresponding to the respective level.

6. The storage device according to claim 5, wherein an address of each latch unit of the plurality of latch units comprises different parts corresponding to different levels, and wherein addresses of latch units in a same group at a same level have a same part.

7. The storage device according to claim 6, wherein the address is binary, and wherein address decoding of the write address corresponding to each level is associated with respective several bits of the write address.

8. The storage device according to claim 5, wherein the address is binary, and wherein address decoding of the write address corresponding to each level is associated with respective several bits of the write address.

9. The storage device according to claim 8, wherein a number of bits of the respective several bits is decided by a number of bits of a binary representation of a ratio of a number of groups obtained from grouping the plurality of latch units at the level to a number of groups obtained from grouping the plurality of latch units at an upper level.

10. The storage device according to claim 4, wherein each clock gating unit of the first stage of clock gating units is coupled, via other stage of clock gating units in the clock gating module, to a respective group of latch units obtained from grouping the plurality of latch units at a first level, and each clock gating unit of the second stage of clock gating units is coupled to a respective group of latch units obtained from grouping the plurality of latch units at a second level below the first level.

11. The storage device according to claim 1, wherein the storage module further comprises an additional latch unit assigned with an address, an input end of the additional latch unit being configured to receive the write data;

the clock gating module further comprises an additional clock gating unit coupled to the additional latch unit and configured to receive the input clock signal and an enable signal obtained based on address decoding of the write address and output an enable clock signal to the additional latch unit.

12. The storage device according to claim 1, further comprising:

a flip-flop unit configured to output the write data to the storage module based on a received clock signal;

a clock source unit coupled to the flip-flop unit and the clock gating module, respectively, and configured to provide the input clock signal; and a clock delay unit coupled between the clock source unit and the flip-flop unit, and configured to receive the input clock signal and delay the input clock signal based on a delay of the enable clock signal received by a latch unit corresponding to the write address in the storage module relative to the input clock signal, and output the delayed input clock signal to the flip-flop unit.

13. The storage device according to claim 12, wherein the clock delay unit comprises one or more of: a clock buffer; an inverter.

14. The storage device according to claim 12, wherein:

the flip-flop unit is triggered by a rising edge, a rising edge of the delayed input clock signal is closer to a rising edge of the enable clock signal received by the latch unit corresponding to the write address in the storage module compared with a rising edge of the input clock signal; or the flip-flop unit is triggered by a falling edge, a falling edge of the delayed input clock signal is closer to a falling edge of the enable clock signal received by the latch unit corresponding to the write address in the storage module compared with a falling edge of the input clock signal.

15. A system-on-chip comprising the storage device according to claim 1.

16. A computing apparatus comprising the system-on-chip according to claim 15.

* * * * *